US012572187B2

(12) United States Patent
Hsieh et al.

(10) Patent No.: US 12,572,187 B2
(45) Date of Patent: Mar. 10, 2026

(54) STORAGE DEVICE CARRIER

(71) Applicants: INVENTEC (PUDONG) TECHNOLOGY CORPORATION, Shanghai (CN); INVENTEC CORPORATION, Taipei City (TW)

(72) Inventors: Han-Chih Hsieh, Taipei City (TW); Hsiu-Hui Kuo, Taipei City (TW)

(73) Assignees: INVENTEC (PUDONG) TECHNOLOGY CORPORATION, Shanghai (CN); INVENTEC CORPORATION, Taipei City (TW)

( * ) Notice: Subject to any disclaimer, the term of this patent is extended or adjusted under 35 U.S.C. 154(b) by 149 days.

(21) Appl. No.: 18/420,499

(22) Filed: Jan. 23, 2024

(65) Prior Publication Data

US 2024/0298418 A1    Sep. 5, 2024

(30) Foreign Application Priority Data

Mar. 3, 2023    (CN) ......................... 202310203614.9

(51) Int. Cl.
| | |
|---|---|
| *G06F 1/18* | (2026.01) |
| *G06F 1/187* | (2026.01) |
| *G11B 33/12* | (2006.01) |
| *G11B 33/14* | (2006.01) |
| *H05K 9/00* | (2006.01) |

(52) U.S. Cl.
CPC ............ *G06F 1/187* (2013.01); *G11B 33/124* (2013.01); *G11B 33/1493* (2013.01); *H05K 9/002* (2013.01)

(58) Field of Classification Search
CPC ... G06F 1/187; G11B 33/124; G11B 33/1493; H05K 9/002
See application file for complete search history.

(56) References Cited

U.S. PATENT DOCUMENTS

| | | | | |
|---|---|---|---|---|
| 10,228,734 B1 * | 3/2019 | Hsieh | ...................... | G06F 1/187 |
| 11,402,881 B2 * | 8/2022 | Zhang | ............... | G11B 33/1493 |
| 2010/0284145 A1 * | 11/2010 | Kang | ...................... | G06F 1/187 |
| | | | | 211/26 |
| 2015/0153789 A1 * | 6/2015 | Liang | ................... | G11B 33/124 |
| | | | | 248/213.2 |

* cited by examiner

*Primary Examiner* — James Wu
(74) *Attorney, Agent, or Firm* — Maschoff Brennan

(57)    ABSTRACT

A storage device carrier is configured for a storage device to be installed thereon and configured for being installed in a casing. The storage device carrier includes a frame, an engagement block and a handle. The frame is configured for the storage device to be installed thereon. The engagement block is slidably disposed on the frame. The handle is pivotably disposed on the frame. The handle is configured to slide the engagement block with respect to the frame so as to be engaged with or detached from the casing.

8 Claims, 5 Drawing Sheets

STORAGE DEVICE CARRIER

CROSS-REFERENCE TO RELATED APPLICATIONS

This non-provisional application claims priority under 35 U.S.C. § 119 (a) on Patent Application No(s). 202310203614.9 filed in China, P.R.C. on Mar. 3, 2023, the entire contents of which are hereby incorporated by reference.

BACKGROUND OF THE INVENTION

Technical Field of the Invention

The present disclosure relates to a storage device carrier, more particularly to a storage device carrier that is easily to be installed.

Description of the Related Art

As an electronic device provided for multiple users, a server requires multiple hard disks to storage substantial amounts of data, and these hard disks must be securely installed to prevent data loss due to sudden impacts.

However, the installation of hard disks in a server involves laborious procedures such as screwing, causing inconvenience during installation or removal of hard disks. Therefore, how to provide a carrier to facilitate effortless installation and removal of hard disks has become a topic issue in the related field.

SUMMARY OF THE INVENTION

The present disclosure provides a storage device carrier capable of facilitating convenient installation and removal of a storage device.

According to one aspect of the present disclosure, a storage device carrier configured for a storage device to be installed thereon and configured for being installed in a casing. The storage device carrier includes a frame, an engagement block and a handle. The frame is configured for the storage device to be installed thereon. The engagement block is slidably disposed on the frame. The handle is pivotably disposed on the frame. The handle is configured to slide the engagement block with respect to the frame so as to be engaged with or detached from the casing.

According to the storage device carrier discussed above, the storage device carrier can be installed into the casing only by operating the handle or only by moving the storage device carrier, and the storage device carrier can be effortlessly detached from the casing only by operating the handle, such that the installation and the removal of the storage device can be easily accomplished.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
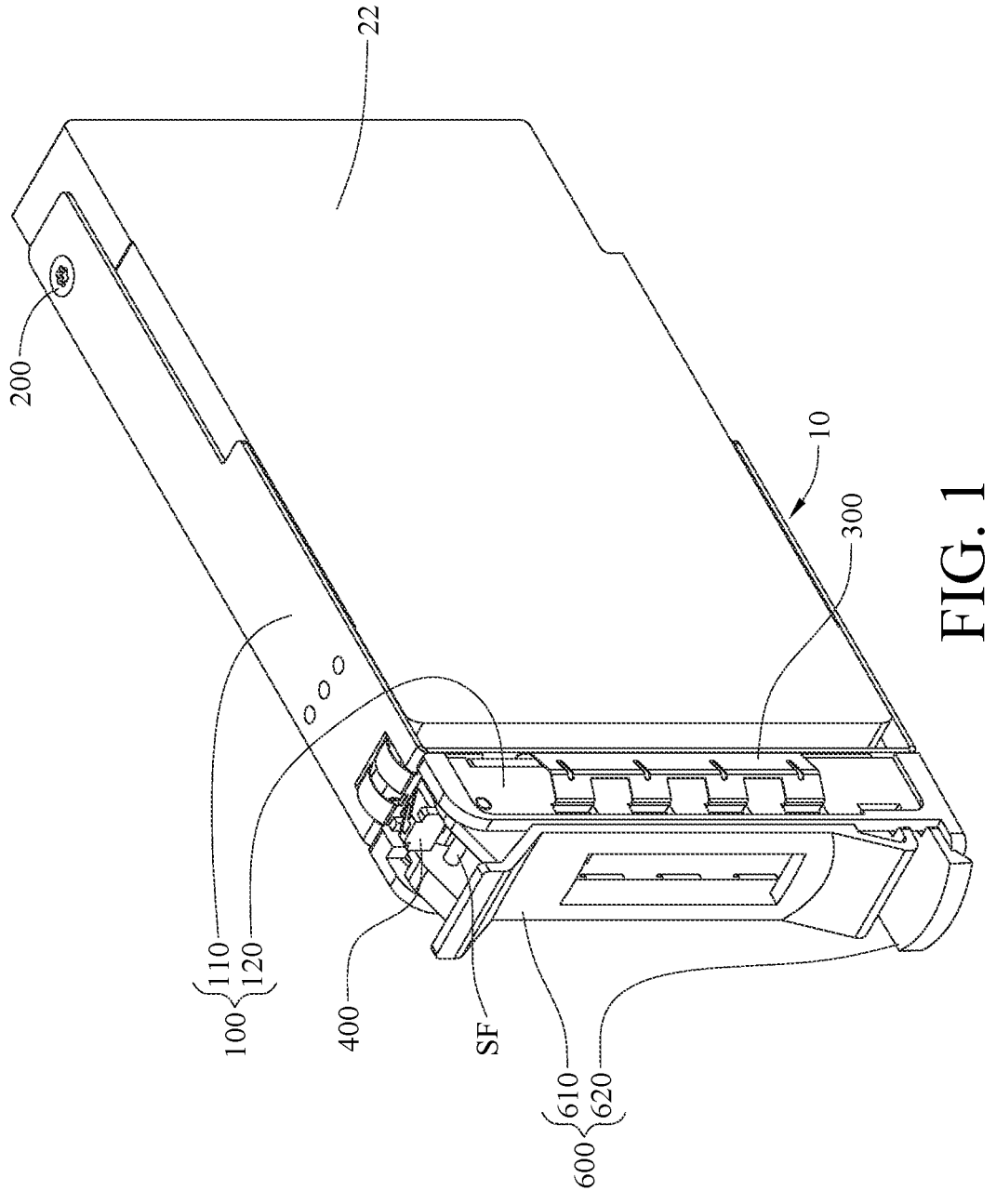
FIG. 1 is a perspective view of a storage device carrier according to one embodiment of the present disclosure with a storage device installed thereon.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
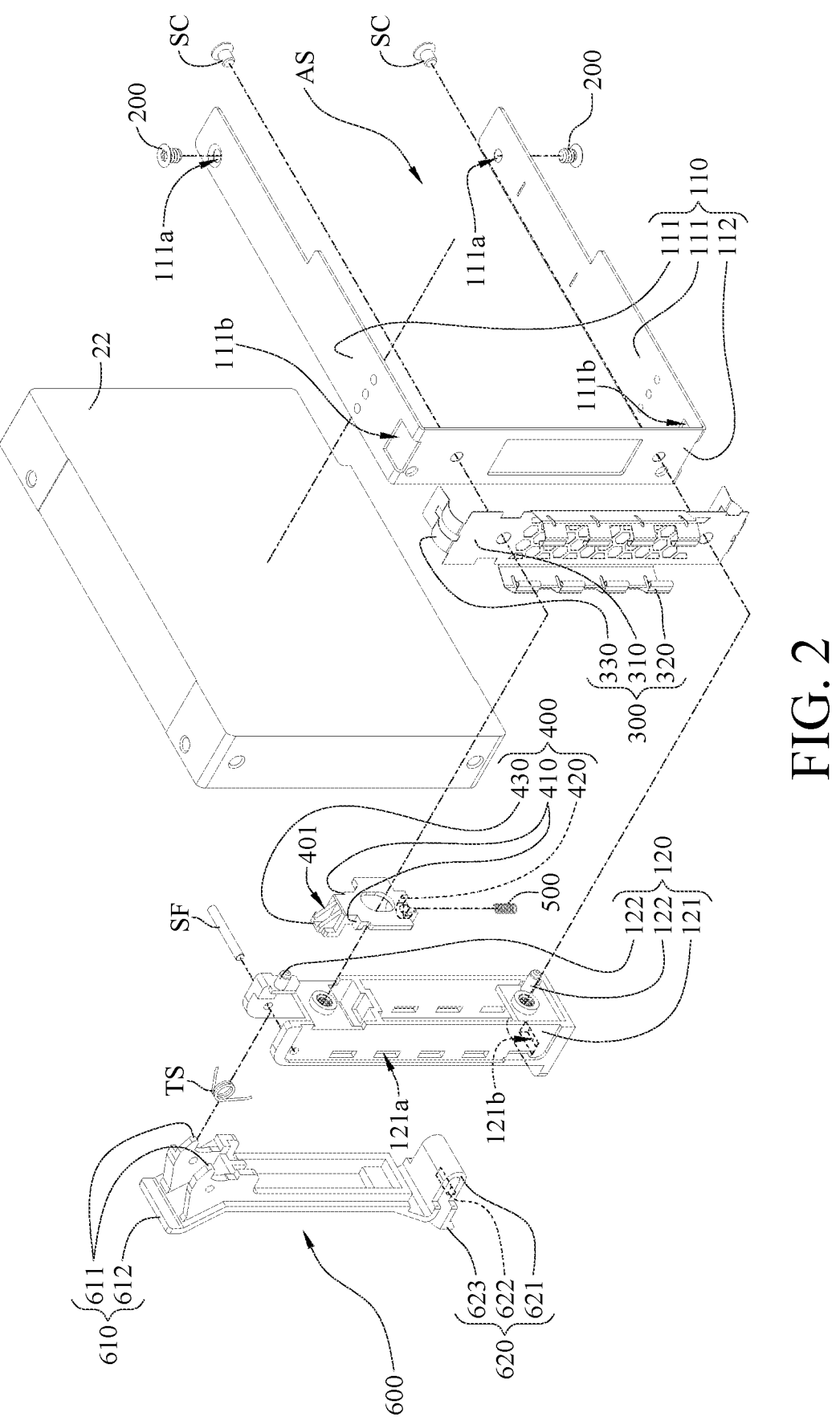
FIG. 2 is an exploded view of the storage device carrier and the storage device in FIG. 1.

In the following, one embodiment of the present disclosure will be illustrated. Please refer to FIG. 1 and FIG. 2, where FIG. 1 is a perspective view of a storage device carrier according to one embodiment of the present disclosure with a storage device installed thereon, and FIG. 2 is an exploded view of the storage device carrier and the storage device in FIG. 1.

Figure 3:
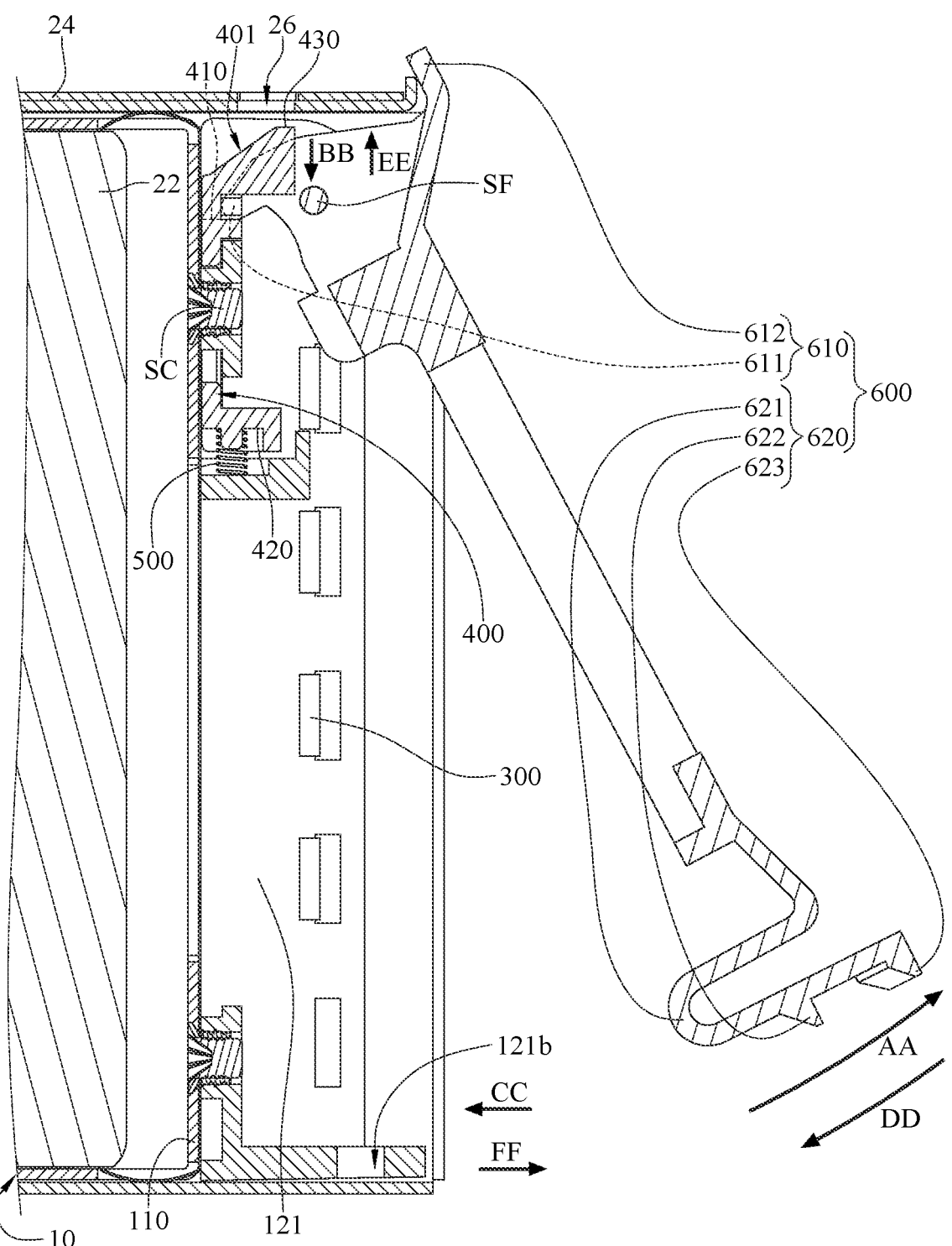
FIG. 3 is a schematic view showing an action to install the storage device carrier and the storage device in FIG. 1 into a casing.
Figure 4:
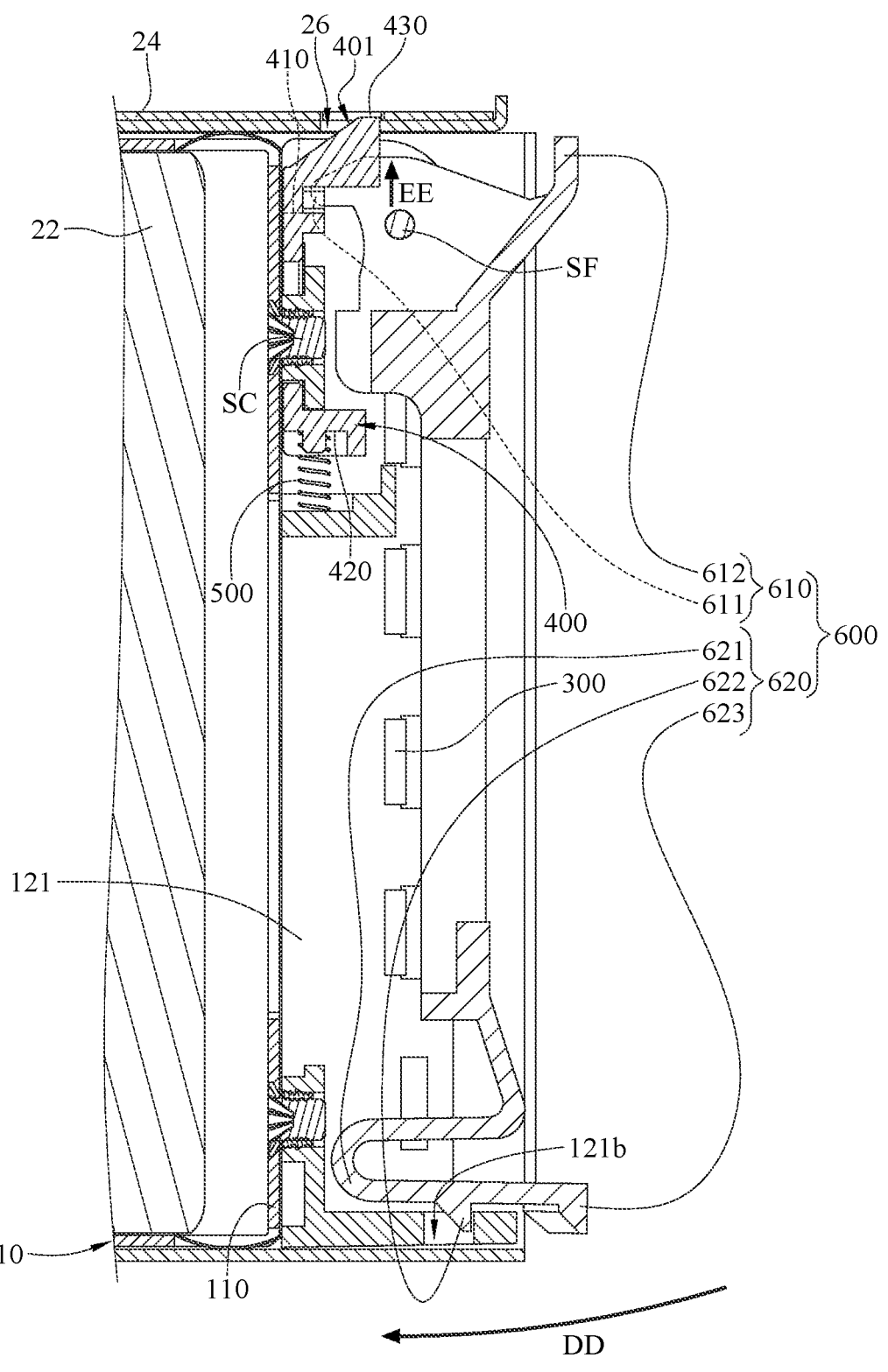
FIG. 4 is a perspective view of the storage device carrier and the storage device in FIG. 1 installed into the casing.

A storage device carrier 10 provided in this embodiment is configured for a storage device 22 to be installed thereon and configured for being installed in a casing 24 (shown in FIG. 3 to FIG. 4). The storage device carrier 10 may be, for example, a hard disk drive carrier. The storage device 22 may be, for example, any kind of a hard disk, such as "E3 SSD", "E3 SSD 2T" and "E1 SSD", wherein the hard disk of "E3 SSD 2T" is twice as thick as the hard disk of "E3 SSD". The casing 24 may be, for example, a part of a hard disk drive cage installed in a chassis of a server.

The storage device carrier 10 may include a frame 100, two fasteners 200, an electromagnetic wave shielding element 300, an engagement block 400, a return element 500 and a handle 600. The frame 100 is configured for the storage device 22 to be installed thereon. Specifically, the frame 100 may include a bracket 110 and a base 120. The bracket 110 may include two arms 111 and a connection body 112. Each arm 111 may have a through hole 111a. The connection body 112 has two opposite ends respectively connected to and located between the arms 111, so that the arms 111 and the connection body 112 together surround an accommodation space AS. The accommodation space AS is configured to accommodate the storage device 22.

The base 120 may include a main body 121 and two positioning posts 122. The main body 121 may be mounted on the connection body 112 through, for example, screws SC. The positioning posts 122 protrude from the main body 121 and are disposed through the connection body 112 to be partially located in the accommodation space AS for positioning a side of the storage device 22. The fasteners 200 may be, for example, screws. The fasteners 200 may be respectively disposed through the through holes 111a of the arms 111 so as to respectively position another two opposite sides of the storage device 22. Accordingly, the storage device 22 can be positioned at three sides thereof, so that the storage device 22 can be held in the accommodation space AS.

The electromagnetic wave shielding element 300 can have at least part clamped between the bracket 110 and the base 120. Specifically, the main body 121 may have a plurality of first insertion holes 121a. Each arm 111 may further have a second insertion hole 111*b*. The electromagnetic wave shielding element 300 may include a main part 310, a plurality of first lateral parts 320 and two second lateral parts 330. The main part 310 can be clamped between the bracket 110 and the base 120. The first lateral parts 320 are connected to the main part 310 and are respectively inserted into the plurality of first insertion holes 121*a*. The second lateral parts 330 are respectively connected to two sides of the main part 310 where the first lateral parts 320 are not connected, and the second lateral parts 330 are respectively inserted into the second insertion holes 111*b*. Accordingly, electromagnetic interference that may affect the operation of the storage device 22 can be prevented at four sides of the storage device 22.

The engagement block 400 is slidably disposed on the base 120 of the frame 100. The engagement block 400 may have two first pushed parts 410, a second pushed part 420, an engagement part 430 and an inclined surface 401. The second pushed part 420 is located opposite to the first pushed parts 410. The engagement part 430 is located opposite to the second pushed part 420 and is configured to be engaged with the casing 24. The inclined surface 401 is located opposite to the second pushed part 420 and is configured for the casing 24 to abut thereon. The return element 500 may be, for example, a spring. The return element 500 is clamped between the main body 121 of the base 120 and the second pushed part 420 of the engagement block 400.

The handle 600 may have a connection side 610 and an operation side 620 that are opposite to each other. The connection side 610 of the handle 600 may be pivotably disposed on the base 120 of the frame 100 through, for example, a pin SF. The connection side 610 of the handle 600 may have two pushing parts 611 and a pressing part 612. The pushing parts 611 of the handle 600 are configured to abut on the first pushed parts 410. The pressing part 612 of the handle 600 is configured to press the casing 24. Moreover, a torsion spring TS may be disposed on the connection side 610 to assist in the pivoting of the handle 600.

The operation side 620 of the handle 600 may have an elastic part 621, an engagement protrusion 622 and an operation protrusion 623. The elastic part 621 may have flexibility. The engagement protrusion 622 is disposed on the elastic part 621. The operation protrusion 623 is connected to the elastic part 621. The main body 121 of the base 120 may further have an engagement hole 121*b*. The engagement protrusion 622 of the handle 600 is configured to be engaged with the engagement hole 121*b* so as to restrict position relationship between the handle 600 and the main body 121. The operation protrusion 623 is configured to move the elastic part 621 to detach the engagement protrusion 622 from the engagement hole 121*b*.

In the following, the installation of the storage device carrier 10, with the storage device 22 positioned thereon, into the casing 24 will be illustrated. Please further refer to FIG. 3 and FIG. 3, where FIG. 3 is a schematic view showing an action to install the storage device carrier and the storage device in FIG. 1 into a casing, and FIG. 4 is a perspective view of the storage device carrier and the storage device in FIG. 1 installed into the casing.

First, the operation protrusion 623 can be pressed to move the elastic part 621, such that the engagement protrusion 622 can be detached from the engagement hole 121*b* to release the position relationship restriction between the handle 600 and the main body 121. Then, as shown in FIG. 3, the handle 600 can be pivoted along the AA direction, such that the pushing parts 611 can push the first pushed parts 410 to move the engagement block 400 along the BB direction towards the return element 500. Then, the storage device carrier 10 together with the storage device 22 can be placed into the casing 24 along the CC direction until the pressing part 612 abuts on the casing 24. Then, the handle 600 can be pivoted along the DD direction that is opposite to the AA direction, so that the engagement protrusion 622 can be engaged with the engagement hole 121*b*. Then, since the pushing parts 611 do not push the first pushed parts 410 at this moment, the return element 500 can push the second pushed part 420 to return the engagement block 400 to its original position along the EE direction that is opposite to the BB direction, such that the engagement part 430 can be engaged with an opening 26 of the casing 24. Accordingly, the storage device carrier 10 and the storage device 22 can be installed into the casing 24, as shown in FIG. 4.

Figure 5:
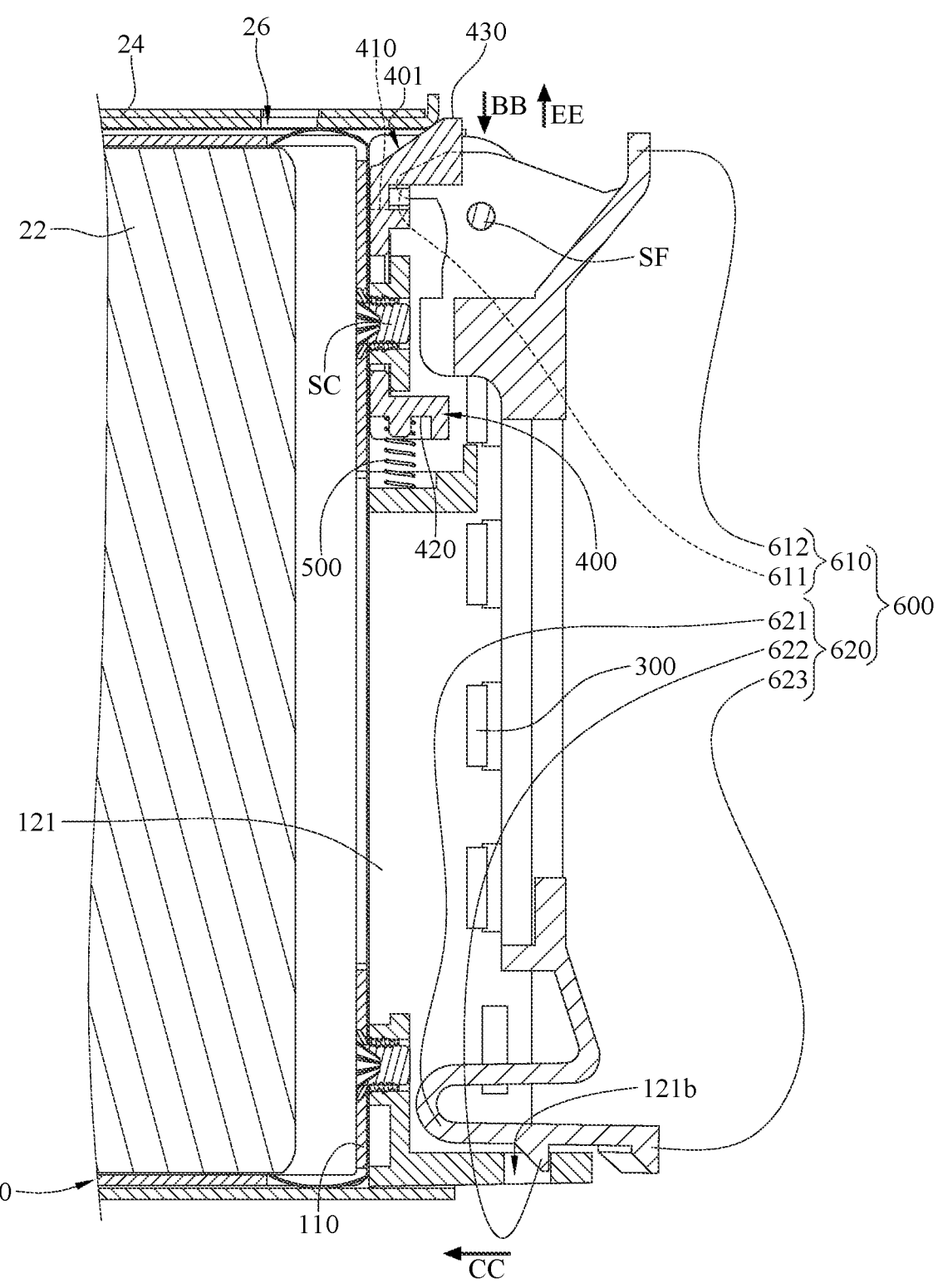
FIG. 5 is a schematic view showing another action to install the storage device carrier and the storage device in FIG. 1 into the casing.

Moreover, the design of the storage device carrier 10 further provides another manner that is able to install the storage device carrier 10, as well as the storage device 22, into the casing 24 without pivoting the handle 600. Please refer to FIG. 5, which is a schematic view showing another action to install the storage device carrier and the storage device in FIG. 1 into the casing. In the state that the engagement protrusion 622 is engaged with the engagement hole 121*b*, the storage device carrier 10 and the storage device 22 can be moved along the CC direction, so that the casing 24 can abut on the inclined surface 401 of the engagement block 400. With the design of the inclined surface 401, the engagement block 400 can be moved along the BB direction after contacting the casing 24. The storage device carrier 10 and the storage device 22 can keep moving along the CC direction until the engagement part 430 is moved to the opening 26 of the casing 24. At this moment, since the casing 24 does not abut on the inclined surface 401 of the engagement block 400, the return element 500 can push the second pushed part 420 along the EE direction to return the engagement block 400 to its original position, such that the engagement part 430 can be engaged with the opening 26 of the casing 24. Accordingly, the storage device carrier 10 and the storage device 22 can also be installed into the casing 24, as shown in FIG. 4.

To detach the storage device carrier 10 and the storage device 22 from the casing 24, as shown in FIG. 3, the operation protrusion 623 can be pressed to pivot the handle 600 along the AA direction, so that the pressing part 612 can press the casing 24. By the principle of leverage, the pressing of the pressing part 612 against the casing 24 can assist detachment of the storage device carrier 10 and the storage device 22 from the casing 24 along the FF direction that is opposite to the CC direction, which is labor-saving and effortless.

Please be noted that the server where the present disclosure applied can be used in artificial intelligence (AI) computing or edge computing, or can be served as a 5G server, a cloud server, or a server for internet of vehicles.

According to the storage device carrier discussed above, the storage device carrier can be installed into the casing only by operating the handle or only by moving the storage device carrier, and the storage device carrier can be effortlessly detached from the casing only by operating the handle, such that the installation and the removal of the storage device can be easily accomplished.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A storage device carrier configured for a storage device to be installed thereon and configured for being installed in a casing, the storage device carrier comprising:

a frame configured for the storage device to be installed thereon, wherein the frame comprises a bracket and a base, the bracket comprises two arms and a connection body that has two opposite ends connected to and located between the two arms, the two arms and the connection body together surround an accommodation space that is configured to accommodate the storage device, the base is mounted on the connection body;

an engagement block slidably disposed on the base of the frame, wherein the engagement block comprises at least one first pushed part, a second pushed part, and an engagement part, wherein the engagement part is located opposite to the second pushed part and is configured to be engaged with the casing;

a return element clamped between the base and the engagement block, wherein the at least one first pushed part and the second pushed part at a side facing away from the return element;

a handle pivotally disposed on the base of the frame, wherein the handle is configured to slide the engagement block with respect to the frame so as to be engaged with or detached from the casing; and wherein the handle has a connection side that has at least one pushing part, when the handle pivots with respect to the base, the at least one pushing part of the handle is configured to push the at least one first pushed part to slide the engagement block with respect to the base.

2. The storage device carrier according to claim 1, wherein the base comprises a main body and two positioning posts, the main body is mounted on the connection body, the two positioning posts protrude from the main body and are disposed through the connection body to be partially located in the accommodation space, and the two positioning posts are configured to position a side of the storage device.

3. The storage device carrier according to claim 2, further comprising two fasteners, wherein each of the two arms has a through hole, and the two fasteners are respectively disposed through the through holes and are configured to respectively position two opposite sides of the storage device.

4. The storage device carrier according to claim 2, further comprising an electromagnetic wave shielding element that has at least part clamped between the bracket and the base.

5. The storage device carrier according to claim 4, wherein the main body has a plurality of first insertion holes, the electromagnetic wave shielding element comprises a main part and a plurality of first lateral parts, the main part is clamped between the bracket and the base, and the plurality of first lateral parts are connected to the main part and are respectively inserted into the plurality of first insertion holes.

6. The storage device carrier according to claim 5, wherein one of the two arms has a second insertion hole, and the electromagnetic wave shielding element further comprises at least one second lateral part that is connected to the main part and inserted into the second insertion hole.

7. The storage device carrier according to claim 2, wherein the connection side of the handle has a pressing part that is configured to press the casing to move the frame with respect to the casing.

8. The storage device carrier according to claim 2, wherein the main body of the base has an engagement hole, the handle further has an operation side opposite to the connection side, and the operation side of the handle has an engagement.

* * * * *